United States Patent [19]

Kang et al.

[11] Patent Number: 4,546,309

[45] Date of Patent: Oct. 8, 1985

[54] APPARATUS AND METHOD FOR LOCATING GROUND FAULTS

[75] Inventors: Chang E. Kang, DeKalb; L. Alan Lowry, Glen Ellyn; Merlin E. Burkum, Elmhurst, all of Ill.

[73] Assignee: Commonwealth Edison Company, Chicago, Ill.

[21] Appl. No.: 416,977

[22] Filed: Sep. 13, 1982

[51] Int. Cl.⁴ ..................... G01R 31/08; G01R 31/02
[52] U.S. Cl. ...................................................... 324/52
[58] Field of Search .................. 324/51, 52, 127, 251; 361/45, 42

[56] References Cited

U.S. PATENT DOCUMENTS 2,651,021  9/1953  Hays ........................................ 324/52
3,891,895  6/1975  Wittlinger ........................ 324/51 X

OTHER PUBLICATIONS

Hp Catalog-79 Edition, pp. 38 and 55, (Clip On Probe Ammeters #428B and #456A).

Primary Examiner—Stanley T. Krawczewicz
Assistant Examiner—Jose M. Solis
Attorney, Agent, or Firm—Emrich & Dithmar

[57] ABSTRACT

An apparatus for locating ground faults on direct current control systems includes a low frequency current generator having a variable output, a Hall-effect current probe for detecting the low frequency current produced by the generator, a filter and amplifier connected to the output of the Hall-effect current probe for identifying and amplifying the low frequency signal and a read-out element connected to the output of the amplifier to indicate the relative magnitude of the low frequency signal. A method for locating ground faults on direct current control system while the system is energized is described.

8 Claims, 4 Drawing Figures

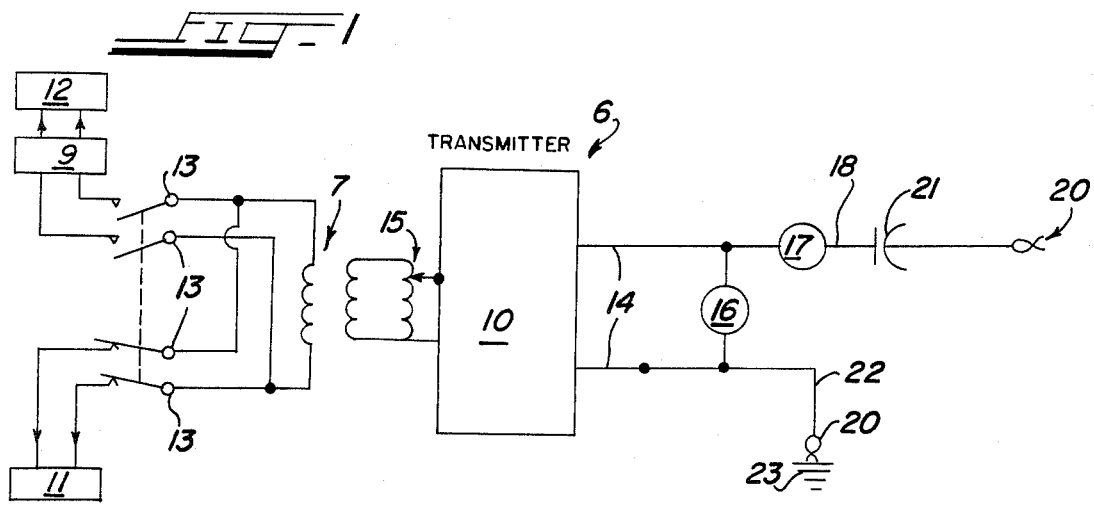
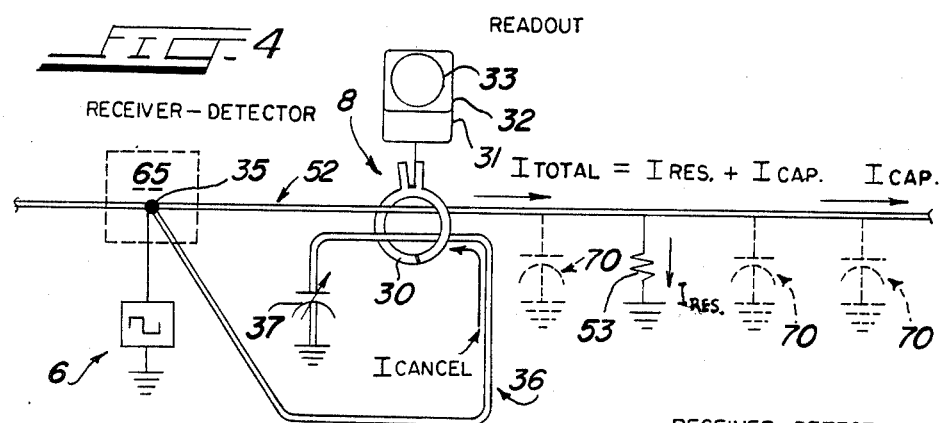
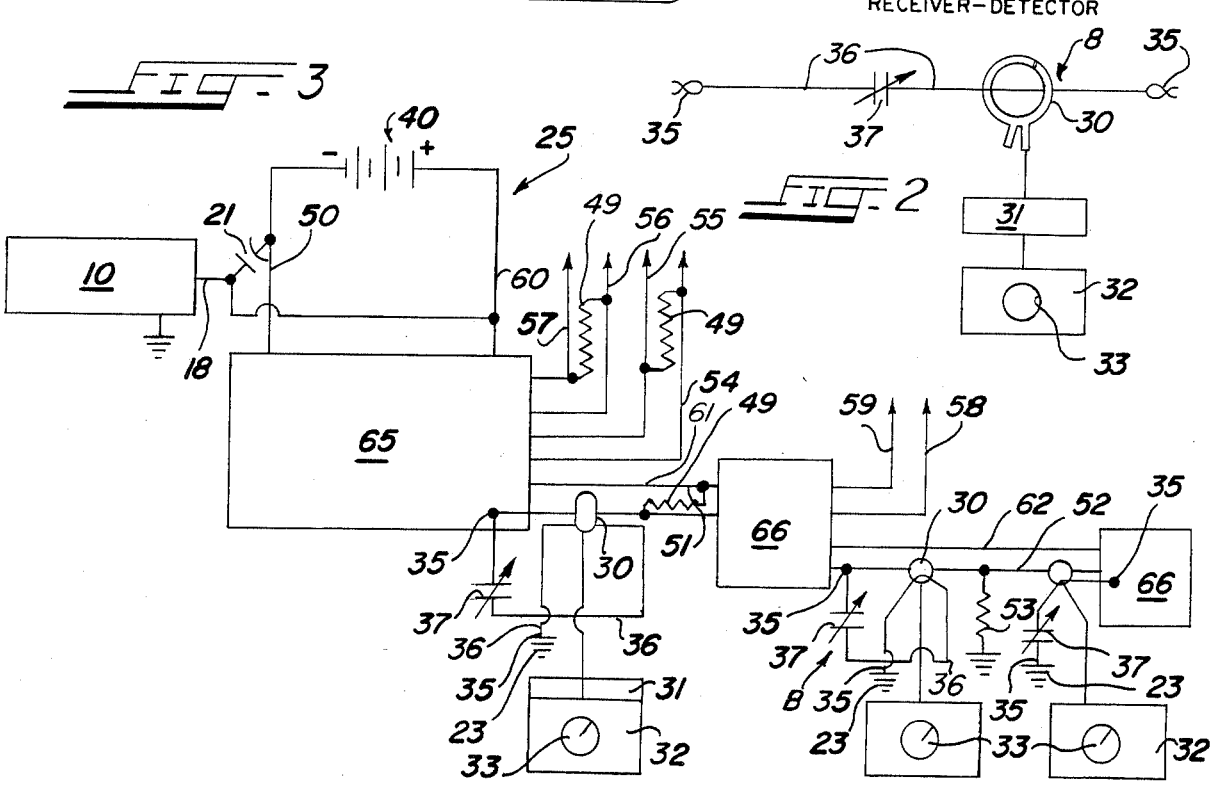

APPARATUS AND METHOD FOR LOCATING GROUND FAULTS

BACKGROUND OF THE INVENTION

The location and identification of ground faults on ungrounded direct current electrical systems which are used extensively in electric utility stations and substations have always presented difficulties to the lineman or technician faced with the problem. Such ungrounded electrical systems are normally energized by a large storage battery of 120-240 volts which supplies circuit breakers, motor operated devices, electronic apparatus and many other items. Also, connected to these direct current electric systems are ground fault relays which protect the generating substation or distribution equipment, such as generators, transformers, and overhead-/underground lines. It is therefore extremely important that these ungrounded direct current electrical systems remain free of low resistance ground faults (generally less than 100,000 ohms) in order to be able to operate equipment connected to the system and to avoid inadvertent disconnection of such equipment as generators, transformers, or electric distribution lines due to false relay operation.

Because the direct current system is by design ungrounded, a single ground fault appearing in such a system will not affect its operation. However, problems and troubles do arise when a second ground appears at a location, which in effect, results in and causes a phantom circuit through ground that may erroneously energize a device, such as a tripping coil for a circuit breaker, which in turn would open the circuit for a critical electric generator.

Additionally, from time to time ground faults will appear in these direct current systems and are due to such causes as moisture, deterioration of insulation or foreign non-insulating materials bridging the "live" conductor to a ground point. Generally, the ground faults first appear as very high resistance faults (generally greater than 100,000 ohms), but as time passes, the fault condition deteriorates to a point whereby a sensitive instrument or fault detector permanently connected to the system indicates that a ground, or multiple grounds, exists which should be located and removed before serious trouble or problems are encountered.

There are several problems which the lineman or technician encounters when locating sources of trouble on these ungrounded direct current systems. First, even when a ground is indicated by the ground detector, it is often very difficult to take the system out of service to locate the trouble. The most common prior art method of locating ground faults utilizes a technique of removing a small section of the system from service; one at a time, by opening switches, and then determining if the signal at the ground fault indicator has cleared. However, these methods have three disadvantages: (1) a portion of the direct current system must be removed from service, and spare equipment either substituted for it or the function abandoned for the time used in locating the fault; (2) because of the sensitivity of these circuits, switching transients may sometimes result in the triggering of relays and unwanted operations of equipment; and (3) if multiple ground faults are present, the sectionalizing procedure is unsatisfactory and will not succeed.

Suggested improvements over the sectionalizing fault location procedure is the use of tracer current methods, a number of which are described in U.S. Pat. Nos. 2,291,533, 2,300,771, 2,651,021 and 4,129,825. In addition to these prior art patents, a technical paper from the Japan IERE Council entitled "Faulty Control Device for D.C. Control Circuit", dated March 1978, describes a low frequency tracer current apparatus for locating grounds on ungrounded battery supplied direct current control systems. In each of these prior art disclosures, the problem of capacitive carry-over current beyond the point of fault is mentioned as a problem and each prior art apparatus utilizes some type of system or equipment in attempting to minimize this effect. Capacitive carry-over current occurs when the capacitive impedance of the cable beyond the location of the fault is sufficiently low in comparison to the impedance of the fault so that a significant tracer current signal can be detected beyond the point of fault. Accordingly, such disclosures attempt to overcome this problem by employing a relatively low frequency for the tracer current so that the signal through the fault is much greater than that of the charging current beyond the fault.

In U.S. Pat. No. 2,300,771, the charging current is cancelled by means of applying an identical signal 180 degrees out-of-phase to a parallel identical non-faulted conductor which is in close proximity to the faulted conductor. However, when utilizing such a technique, it is necessary to have the magnetic pickup of the detecting device encircle both of these conductors at the same time for the charging current signals to cancel. Also, the conductors must not be a pair which is serving a load(s) for which the fault must be found while the system remains in operation and for which a parallel, identical, unfaulted and unrelated conductor is available. Thus, such a technique has been unacceptable to the power generation industry.

Additionally, all known prior art tracer current methods utilize conventional magnetic pickup devices which are susceptible to stray electric and magnetic fields external to that produced by the tracer current in the faulted conductor. This is particularly true in electric generating stations and substations where very large magnetic and electric fields are ubiquitous. Thus, a high frequency tracer current results in undue charging carry-over current problems while a low frequency tracer current is difficult to detect and efficiently filter before measuring or amplifying the signal. The 32 hertz signal utilized by the prior art device, described in the Japan IERE paper, is too close to the first sub-harmonic of the 60 hertz power frequency used in the United States for efficient filtering of unwanted stray signals and the 10 hertz signal utilized in U.S. Pat. No. 2,651,021 is too low for efficient detection of small tracer currents through high resistance faults. Accordingly, such suggested tracer techniques have not been acceptable for locating grounds on energized ungrounded direct current systems.

SUMMARY OF THE INVENTION

It is an objective of the present invention to provide a method and apparatus which will accurately and efficiently locate low or high resistance ground faults on ungrounded direct current electric service systems, normally energized by storage batteries, without interrupting service to any of the loads connected to the direct current system.

It is another object of the present invention to provide a tracer current method of identifying and locating faults on ungrounded direct current systems which substantially reduces or eliminates the effect of capacitive carry-over signals in detecting the precise location of a ground fault.

It is still another object of the present invention to provide a tracer current method of locating ground faults in ungrounded direct current systems where electric and magnetic fields external to that of the tracer current does not interfere with the fault location circuit.

It is a further object of the present invention to provide a tracer current method of precisely locating ground faults in direct current systems wherein the frequency of the tracer current is sufficiently low to avoid undue capacitive carry-over current, but high enough to assure efficient filtering for signal discrimination and wherein the frequency of the tracer current is remote from the harmonic or subharmonic of the common power frequency (e.g. 60 hertz) employed in the area.

Briefly, the apparatus for locating ground faults in accordance with one embodiment of the present invention is useful as an apparatus for quickly and accurately locating and pinpointing low or high resistance ground faults on ungrounded direct current electrical supply systems. The fault locating apparatus includes a transmitter portion and a receiver portion. The transmitter portion includes a power supply section which may either be energized by a 120 volt alternating current convenience outlet, or a storage battery for portable use. The output of the transmitter portion is a 25 hertz signal with a variable output voltage of 0 to 120 volts. The 25 hertz tracer current frequency is half way between the first and second subharmonics of the fundamental 60 hertz power frequency. Also, included in the transmitter portion are measuring means for measuring the output voltage and current. The measuring means requires about a minimum of 1 milliampere of a 25 hertz output current through the ground fault in order to successfully and adequately detect and trace the current to the fault. Therefore, a 120 volt output voltage at the transmitter will normally provide more than a minimum tracer current signal through a 100,000 ohm ground fault condition.

The receiving-detecting portion of the apparatus for locating ground faults includes a split-core "Hall-Effect" detector or probe which is readily positioned around the faulted conductor carrying the 25 hertz tracer current. The Hall detector or probe is utilized because it is more sensitive to low frequency magnetic fields (actually it is independent of frequency) than are conventional split-core current transformers. Also, the Hall detector or probe design lends itself to efficient shielding from external magnetic fields which greatly affect accuracy. Additionally, the output of the Hall detector or probe to the measuring or readout means is more accurate and reproducible than the output of a split-core current transformer.

Connected to the Hall current detector or probe is a signal amplifier and filter circuit. For greatest selectivity, it is preferred that the filter be positioned ahead of the amplifier; however, for packaging and commercial convenience, it may be sometimes advantageous to have the amplifier be positioned ahead of the filter. Following the amplifier-filter circuit is a detecting means or readout element. For ease of reading and accuracy, a digital voltmeter is preferred; however, it is within the scope of the present invention that other indicating devices which provide a relative measure of received signal strength are acceptable.

The use of the very low frequency (25 hertz) assists in avoiding capacitive carry-over problems and in avoiding any possible interference problems from subharmonics of nearly 60 hertz power frequency installations. Additionally, in order to further substantially reduce and eliminate the problem of capacitive carry-over signals, a circuit is provided which permits the lineman or technician to cancel out this misleading carry-over signal to provide that only the resistive component through the fault is detected by the split-core Hall detector or probe. This novel result is accomplished by a simple circuit consisting of a variable capacitance connected on one side to the faulted conductor and on the other side of the faulted conductor to a conductor which passes through the split core of the Hall-effect detector prior to its connection to ground. The conductor is passed through the Hall-effect detector in such a manner that the direction of current to ground is opposite to that of the direction of tracer current to ground in the faulted conductor. Thus, by varying the capacitance of this circuit, a value will be obtained which will yield a minimum indication or value on the voltmeter. This minimum value is a true and exact indication or measure of the resistive current which flows through the fault because the capacitive carry-over current is now balanced out by the 180 degrees capacitive current artificially superimposed within the Hall-effect detector or probe by the variable capacitance to ground.

The precise location of a fault is determined by taking measurements of the tracer current through the faulted conductor balancing out the capacitive carry-over signal, and noting the location where the resulting resistive component drops to zero, or, if there is another ground fault present beyond the first location, drops in value radically.

DESCRIPTION OF THE DRAWINGS

FIG. 1 is a schematic drawing illustrating the elements of the transmitter portion of the ground fault locator in accordance with the present invention;

FIG. 2 is a schematic drawing illustrating the elements of the receiver-detector portion of the ground fault locator in accordance with the present invention;

FIG. 3 is a schematic drawing illustrating an ungrounded battery supplied direct current distribution system and the method of attaching the transmitter portion and receiver portions of the ground fault locator to the distribution system in order to determine the precise location of a fault in accordance with the present invention; and FIG. 4 is a schematic drawing illustrating the use of the transmitter-receiver portions to sense a ground fault on a cable section and cancel out undesired capacitive, carry-over signals, in accordance with the present invention.

DETAILED DESCRIPTION OF THE INVENTION

Referring now to the drawings wherein like numerals have been used throughout to several views to identify the same or similar parts, in FIGS. 1 and 2, for one embodiment of the present invention the two components of the ground fault locator apparatus in accordance with one embodiment of the present invention are shown as the transmitter portion 6 (FIG. 1) and the detector-receiver portion 8 (FIG. 2).

In the transmitter portion 6, a 25 hertz oscillator (or 60 hertz to 25 hertz frequency converter) and amplifier 10 receives its power from a 120 volt 60 hertz (nominal) alternating current source 11, or from a 120 volt, 60 hertz inverter 9 powered by a storage battery 12, when a fixed source of power 11 is not available. Switches 13 accept either of the above energy sources, as desired. A 120 volt to 120 volt isolation transformer 7 isolates unintentional grounds in the power supply circuitry 11, 12, 9 from the normally ungrounded direct current system 25 which is to be tested for ground faults. A variable transformer 15 provides a 60 hertz output of between zero and 120 volts to the transmitter 10. The current output from transmitter 10 at the terminal 14 must be capable of supplying the charging current of the entire direct current system 25 (FIG. 3) being tested. In addition to the current which flows through any grounds on the system 25. The output 14 of the transmitter 10 is controlled by the variable transformer 15. A voltmeter 16 and milliammeter 17 measures and determines the output voltage 14 and current from the transmitter 10. One side of the output 14 of transmitter 10 is grounded through lead 22. An insulated conductor 18 includes spring loaded clips 20 which are used to attach the outputs of the transmitter 10 through coupling capacitors 21 to the direct current distribution system 25 (as shown in FIG. 3) which has a ground fault 53 present therein, as will hereinafter be described.

In order to precisely determine the location of the ground fault 53 on a direct current system 25 supplied by storage battery 40 (in FIG. 3), it is necessary only to connect one lead 18 to either the positive terminal 60 or negative terminal 50, whichever one has the ground fault 53. Because a storage battery 40 possesses a low impedance, it normally will not be important which terminal the lead 18 is connected to, the battery 40 by acting as a near short circuit.

Also, shown in FIG. 2 is the detector-receiver portion 8 of the ground fault locating apparatus. A split-core, Hall-effect detector probe 30 is placed around the faulted cable 51, 52 of the direct current system in FIG. 3 which detects the 25 hertz signal from the transmitter 10. The signal detected in the Hall-effect probe 30 is fed through a narrow 25 hertz-band-pass filter 31 and the 25 hertz output signal is amplified 32 and the signal magnitude displayed by readout means or meter 33, which is preferred to be a digital voltmeter. All cables 51-61 connected to the transmitter 10 will have about a 25 hertz charging current on their conductors. Unexpectedly, this range of charging current has been found to be highly significant in comparison with the current through the fault 53. Therefore, a simple compensating circuit, as shown in FIG. 2, which is comprised of a variable capacitor 37 to which insulated leads 36 having spring loaded clips 35 are connected to both ends thereof and is employed to balance out the effects of the capacitive carry-over current. This is accomplished by connecting one of the clips 35 to the uninsulated conductor cable 51 at the distribution cabinet 65 near the point where the transmitter 10 is connected and the other clip 35 is attached to a ground, depicted as 23 in FIG. 3.

FIG. 4 illustrates the method of connecting the transmitter 6 and receiver 8 to a cable for the purpose of exciting and then detecting a flow of alternating current through the cable 52 to the ground fault 53. FIG. 4 illustrates also the method of attaching the variable capacitor 37 and associated leads 36 so as to cancel out undesired carry-over, capacitive current Icap which results from distributed cable capacitance 70. By proper adjustment of the variable capacitor 37, where the capacitor 37 approximates the cable capacitance 70 and results in a capacitive current Icancel, which is equal and opposite to Icap. through the probe 30, a minimum reading is obtained on the read out means 33 which then represents the resistive current (Ires.) flowing to the ground fault 53. When no ground fault 53 exists and the variable capacitor 37 is properly adjusted, the reading of the readout means 33 is zero or negligible.

When a measurement is required at a point distant from the distribution cabinet 65 and where an uninsulated cable 51 is not available, a spring loaded clip lead, similar to lead 22, but also having a sharp needle-like spear to puncture the cable's rubber or plastic insulation may be used to contact the conductor of the cable 51. After making the measurement, the slight hole in the insulation may be taped over to assure the continued reliability of the cable and system. It is preferred that the current in insulated lead 36 passes through the split core 30 in such a direction so as to oppose the capacitive carry-over current in cable 51. The value of variable capacitor 37 is controlled and varied in such a manner to obtain a minimum indication on the current indicator 33. For faulted conductors (51 and 52) this minimum value is the current through the fault 53. For an ungrounded conductor 54-61, the minimum value should be near zero.

To precisely locate a ground on a direct current system 25, the transmitter's 10 output is connected to both the positive terminal 60 and negative terminal 50 terminals of the battery supply and the ground lead 22 connected to a convenient ground potential point 23 utilizing spring loaded clip 20. The transmitter 10 is then energized by either plugging into a 120 volt alternating current source 11 or utilizing a portable battery 12. Variable transformer 15 is adjusted to increase the voltage from zero to a value which will give a sufficient current (at least one miliampere) through the ground fault to permit accurate detection by the split-core Hall-effect probe 30.

Thereafter, the split-core probe 30 is connected around each of the cables (one at a time) exiting the first distribution cabinet 65, as shown in FIGS. 3 and 4. The variable capacitor 37 and its leads 36 are also connected, as shown in FIGS. 3 and 4, with one lead 36 looping through the split-core probe 30. The variable capacitor 37 is then adjusted for a minimum reading at each cable. Cables having no fault, will have a near zero indication after the capacitor 37 is adjusted to the minimum, while the faulted cables will have a significant residual current, which generally remains constant at each measurement point between the transmitter 10 and location of the ground fault 53. This will be true for conditions where there is either a single fault or multiple faults on a single cable. Where ground faults exist on more than one cable, the 25 hertz signal through the ground will split at the distribution cabinets and each fault must be separately traced. However, in each case, nulling out the capacitive carry-over current will aid in tracing the true 25 hertz signal traveling through the cable to identify the precise location of the ground faults.

What has been described is a novel apparatus for precisely locating ground faults on electric cables of ungrounded direct current power control systems.

The present invention affords also a novel method for locating ground faults on ungrounded direct current power control cables, which method includes the steps of applying a low frequency voltage to ground to each of the positive and negative cables in the system to thereby flow therein, creating a second current conducting path through a variable capacitor and flexible current conducting leads to ground, determining or deflecting the minimum magnetic field in the ground by cancelling the effect of the opposing low frequency currents through the power cables and the second conducting path with an optimum adjustment of the capacitor and locating the ground fault by observing when the minimum detected magnetic field is radically or substantially reduced.

Thus, while we have illustrated and described the preferred embodiments of the present invention, it is to be understood that these are capable of variation and modification, and we therefore do not wish to be limited to the precise details set forth but desire to avail ourselves of such changes and modifications as fall within the purview of the following claims.

We claim:

1. An apparatus for precisely locating unintentional grounds on electric cables or ungrounded direct current power control systems, including in combination,
    a low frequency electric current generator having a variable output voltage for generating a low frequency current signal and which is to be operatively connected to the cables of an ungrounded direct current power control system;
    a Hall-effect current probe having a split magnetic core for positioning about and around the cables of said control system for detecting a low frequency current signal in the cables produced by said generator;
    a narrow band-pass filter connected to the output of said Hall-effect current probe for substantially blocking all signal frequencies except the low frequency signal transmitted on said cables in said signal generator;
    a signal amplifier connected to the output of said band-pass filter for amplifying said low-frequency signal;
    a first current connecting lead having a first and second end of which the first end of said first conducting lead is connected to a faulted cable of the ungrounded direct current power control system;
    a variable capacitor having a first and second terminal wherein said first terminal is connected to the second end of said first conducting lead; and
    a second current conducting lead having a first and second end of which the first end is connected to said second terminal of said variable capacitor and said second end of said first conducting lead is passed through said magnetic core and connected to ground such that the direction of the low frequency current in said second conducting lead is in a direction to oppose the effect of the low frequency current in the faulted cable, and
    readout means connected to the output of said amplifier for indicating the relative magnitude of said low frequency signal to identify the precise location of the ground fault.

2. The apparatus in accordance with claim 1 wherein said low frequency current signal generated by said current generator is about 25 hertz.

3. The apparatus in accordance with claim 1 wherein said low frequency electric current generator has an output voltage variable from zero to 130 volts.

4. The apparatus in accordance with claim 1 wherein said amplifier is first connected to the output of said Hall-effect current probe, and said band-pass filter is connected to the output of said amplifier.

5. The apparatus in accordance with claim 1 wherein said readout means is a voltmeter.

6. A method for locating ground faults on ungrounded direct current power control cables, including the steps of:
    applying a low frequency voltage to ground to each of the positive and negative cables of a normally ungrounded direct current power system, whereby a low frequency current signal is caused to flow in the cables of said power system;
    creating a second current conducting path through a variable capacitor and flexible current conducting leads to ground;
    detecting the value of the minimum current in the ground faulted cable by utilizing the cancelling effect of the opposing low frequency currents through the power system cables and said second current conducting path with an adjustment of said variable capacitor; and
    locating the ground fault by noting the point on the faulted cable where said value of minimum detected current is substantially reduced.

7. The method in accordance with claim 6 wherein said low frequency current signal is about 25 hertz.

8. The apparatus in accordance with claim 3 wherein said low frequency current signal generated by said current generator is about 25 hertz.

* * * * *

UNITED STATES PATENT AND TRADEMARK OFFICE
CERTIFICATE OF CORRECTION

PATENT NO. : 4,546,309

DATED : October 8, 1985

INVENTOR(S) : Kang, Lowry and Burkum

It is certified that error appears in the above-identified patent and that said Letters Patent is hereby corrected as shown below:

Column 3, line 9, after "location", insert --detection--;

Column 5, line 36, delete "by";

Column 5, line 55, delete "to", insert --on--.

Signed and Sealed this

Seventh Day of January 1986

[SEAL]

Attest:

Attesting Officer

DONALD J. QUIGG

Commissioner of Patents and Trademarks